United States Patent [19]

Janko et al.

[11] Patent Number: 4,924,362

[45] Date of Patent: May 8, 1990

[54] ILLUMINATED ARTICLE AND WATERPROOF ILLUMINATED HARNESS

[75] Inventors: Michael Janko, Richmond; Matthew McAllister, Lexington, both of Mich.

[73] Assignee: Alliko Unlimited Corporation, Anchorville, Mich.

[21] Appl. No.: 239,448

[22] Filed: Sep. 1, 1988

Related U.S. Application Data

[63] Continuation-in-part of Ser. No. 897,192, Aug. 15, 1986, Pat. No. 4,774,642.

[51] Int. Cl.$^5$ ............................................. F21L 15/08
[52] U.S. Cl. ..................................... 362/108; 362/186; 362/234; 362/238; 362/240; 362/158; 362/252
[58] Field of Search ................. 340/321; 362/108, 103, 362/104, 186, 800, 806, 234, 238, 240, 249, 252, 158

[56] References Cited

U.S. PATENT DOCUMENTS

| | | | |
|---|---|---|---|
| 2,721,257 | 10/1955 | Knox | 362/108 |
| 3,153,745 | 10/1964 | Gurian et al. | 340/321 X |
| 3,641,333 | 2/1972 | Gendron | 362/108 |
| 4,164,008 | 8/1979 | Miller et al. | 362/103 |
| 4,451,871 | 5/1984 | Kirkley et al. | 362/186 |
| 4,480,293 | 10/1984 | Wells | 362/108 |
| 4,523,258 | 6/1985 | Morse et al. | 362/108 |
| 4,570,206 | 2/1986 | Deutsch | 362/103 |

FOREIGN PATENT DOCUMENTS 383620 2/1931 United Kingdom ................ 362/108

*Primary Examiner*—Stephen F. Husar
*Attorney, Agent, or Firm*—Basile and Hanlon

[57] ABSTRACT

An illuminated article in the form of a garment or article of wearing apparel includes an electrically conductive harness mounted at predetermined locations on the outer surface of the garment. The harness includes a housing which waterproofingly encloses an illumination device, such as a light emitting diode. A pair of electrical conductors mounted in an elongated strip are connectable to the leads of the light emitting diodes. An electrical power source including a battery and an on-/off switch is mounted in a waterproof housing and receives one end of the electrical conductors to connect the illumination devices to the battery for selectively illuminating the illumination devices. A plurality of harnesses may be mounted on the article and interconnected by a waterproof connector which connects the electrical conductors in each harness together. In a preferred embodiment of the harness, each light emitting diode and attached portions of the electrical conductors are inserted into a mold which then has a housing molded therearound to form a watertight, corrosion-free enclosure about each light emitting diode.

21 Claims, 7 Drawing Sheets

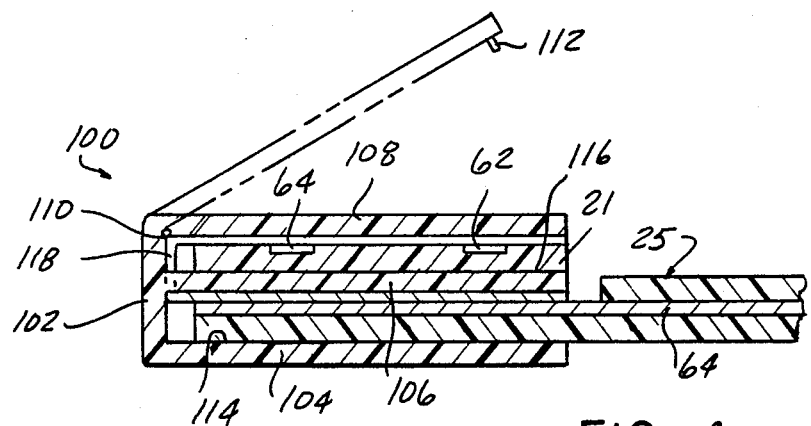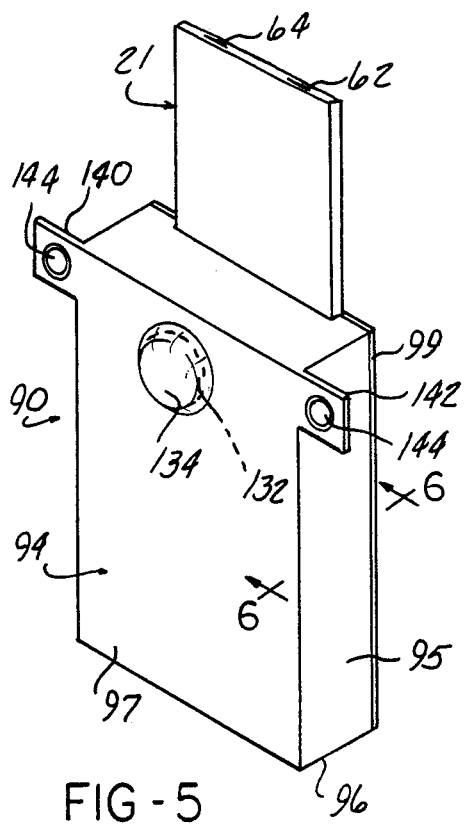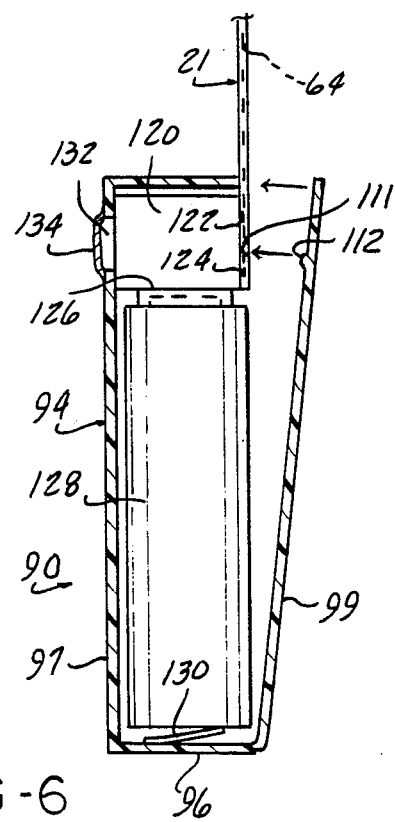

ILLUMINATED ARTICLE AND WATERPROOF ILLUMINATED HARNESS

CROSS REFERENCE TO CO-PENDING APPLICATION

This application is a continuation-in-part application of co-pending application Ser. No. 897,192, filed on August 15, 1986 in the names of Michael Janko and Matthew McAllisten, now U.S. Pat. No. 4,774,642.

BACKGROUND OF THE INVENTION

1. Field of the Invention

The present invention relates, in general, to illuminated articles and, more specifically, to illuminated garments and other articles of wearing apparel.

2, Description of the Prior Art

Illuminated articles, such as sweatshirts, jackets, t-shirts, belts, etc., have been previously provided with a number of lights, such as LEDs, which are mounted on each article, and connected to an electrical circuit housed within or mounted on the article of wearing apparel. The circuit includes a power source, such as a battery, which is also mounted on the article of wearing apparel.

Such illuminated articles are used for decorative purposes, or to embellish a particular design formed on the garment or wearing apparel. Also, such articles have been used as safety indicators for joggers, runners, walkers, cyclists, etc., to illuminate the wearer in night or low light conditions for approaching vehicles.

Typically, a battery pack is mounted within the article or garment and connected by a flexible electrical circuit board attached to the garment in a pre-determined design or shape on the garment. A number of LEDs are electrically connected to the circuit board and, typically, protrude through apertures formed in the outer surface of the garment for ease of visibility.

Thus, the LEDs are fixed in a pre-set location on the garment. Also, the LEDs and the attached circuit board and battery pack are not able to be easily removed from the garment for cleaning or washing of the garment nor are they waterproof themselves. Further, it is difficult if not impossible to produce a flexible mylar circuit board capable of carrying and activating an illuminatible device.

In order to improve upon and overcome the deficiencies in the previously devised illuminated articles of wearing apparel, it would be desirable to provide an illuminated article, preferably an article of wearing apparel or a flotation device, in which the illumination devices, such as LED's, are easily re-positionable in any design or location on the article. It would also be desirable to provide an illuminated article in which the illuminating devices are easily attachable to an electric circuit or harness and power source housed within the garment or article. It would also be desirable to provide an illuminated article in which the entire electrical circuit including the battery pack, illumination devices and conductors are completely waterproof thereby enabling the garment to be cleaned or washed or used in a wet or high moisture environment. It would also be desirable to provide an illuminated article in which the illumination devices are not visible when de-activated. Finally, it would be desirable to provide an illuminated article in which the illumination circuit mountable on the article or garment provides an aesthetically pleasing appearance when the illumination devices are not activated.

SUMMARY OF THE INVENTION

The present invention is an illuminated article, preferably an illuminated garment or article of wearing apparel. An electrically conductive harness means is mounted on the article or garment at any desired location. The harness means includes a pair of electrical conductors connected to an electrical power source carried by the article. A plurality of illumination means, such as light emitting diodes (LEDs) are connected at spaced locations to the electrical conductors. Until now, side emitter LEDs have only been adapted for use in infrared light and never for use in visible light. However, it is unexpectedly an excellent choice for this invention.

A housing is molded about each illumination device and attached portion of the electrical conductors and forms a watertight, corrosion-free enclosure. Initially, each side emitter LED is inserted in the center of a pre-load square. The preload square is then placed in a mold cavity and a housing is formed thereabout to encapsulate the LED in a watertight enclosure. After encapsulating the LED, while the housing is still hot, a lens is placed within the housing or over the housing to allow the illuminated portion of the LED to be seen when illuminated.

At least one layer of a transparent or semi-transparent material, preferably from the polymer group, is attached at its outer edges to the garment at any desired location or in any configuration on the garment. This forms a slot between itself and the surface of the garment which slidably receives the harness. This effectively hides the harness from view when the illumination devices are not activated, thus providing an aesthetically pleasing appearance even when the illumination devices are not activated.

The present illuminated article, which is particularly suited for illuminating portions of garments or other articles of wearing apparel, overcomes many of the problems encountered with previously devised illuminated articles or wearing apparel. For one, the illumination devices, preferably LED's, do not protrude through the exterior surface of the garment. Rather, the illumination means and the attached electrical circuit are housed beneath at least one layer of either transparent or translucent material attached to a surface of the garment. This provides a pleasing, aesthetic look to the garment. Also, forming the layer from a transparent or semi-transparent material effectively hides the illumination devices and harness from view when such devices are not illuminated. Thus, the garment can be worn normally during daylight hours when the illumination devices are not required or activated and still provide a pleasing appearance. Further, the encapsulation of the LED leads and electrical conductors with the LEDs creates a corrosion-free, waterproof connection which has not been previously provided in any other illuminated article.

In other applications, such as a pet collar formed of a thick band, the housing is constructed in a waterproof manner about each LED and the attached connections to the electrical conductors, with the LED aligned with an aperture formed in the band and the housing filling the aperture and surrounding all sides of the band. In another application involving thinly woven fabric, the process of molding a housing about each LED causes the plastic to completely penetrate the fabric to securely attach the harness at each LED location to the fabric. This enables the waterproof illuminated harness of the present invention to be employed on many different articles and be formed in any desired configuration.

BRIEF DESCRIPTION OF THE DRAWING

The various uses, advantages and other features of the present invention will become more apparent by referring to the following detailed description and drawing in which:

FIG. 4 is an enlarged cross-sectional view generally taken along line 4—4 in FIG. 1;

FIG. 5 is a perspective view of the electrical power source employed in the present invention;

FIG. 6 is a cross-sectional view generally taken along line 6—6 in FIG. 5;

DESCRIPTION OF THE PREFERRED EMBODIMENTS

Figure 1:
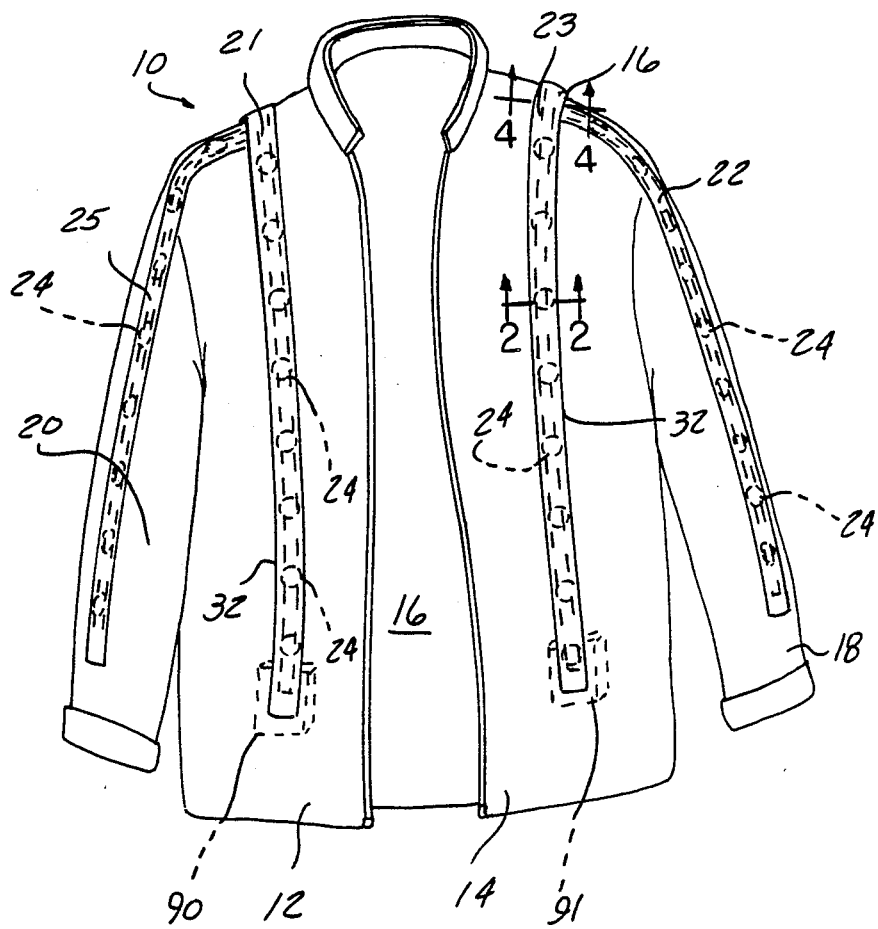
FIG. 1 is a perspective view of an article having the illumination device of the present invention mounted thereon.

Throughout the following description and drawing, an identical reference number is used to refer to the same component shown in multiple figures of the drawing.

The present invention is an illuminated article 10, such as, for example, an article of wearing apparel. Such a device or article of wearing apparel 10 can be a sweatshirt, t-shirt, jacket, life jacket flotation device, belt, etc. Although a jacket is described and illustrated in the present invention, it will be understood that this is by way of example only and that the present invention may be employed in other articles even if such articles are not garments or wearing apparel.

Referring to FIG. 1, the illuminated article 10 is illustrated as comprising a jacket having two front surfaces 12 and 14, a back 16 two spaced sleeves 18 and 20. The jacket 10 may have any form or shape and does not form a part of the present invention.

A plurality of illumination devices 24 are mounted at predetermined, spaced positions in electrically conductive harnesses 21, 22, 23 and 25 attached in a preselected form on the jacket 10. The harnesses 21, 22, 23 and 25 may be positioned at any desired location on the front surfaces 12 and 14, the sleeves 18 and 20 or the back 16 of the jacket as desired for the particular application of this invention. By way of example, harnesses 21 and 23 are mounted on the front and back surfaces of the jacket 10. Harnesses 22 and 25 are mounted or attached to the sleeves 18 and 20 of the jacket 10.

Preferably, the illumination device 24 comprise light emitting diodes or LEDs. Any conventional LED may be employed; however, LEDs having a low height or profile are preferred for use in this illuminated article 10.

Figure 2:
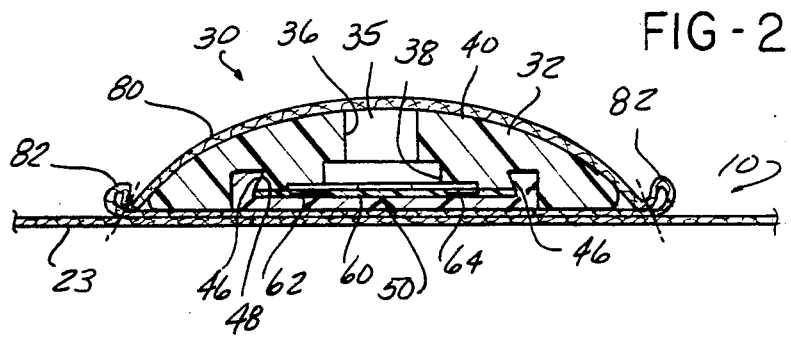
FIG. 2 is a cross-sectional view generally taken along line 2—2 in FIG. 1.
Figure 3:
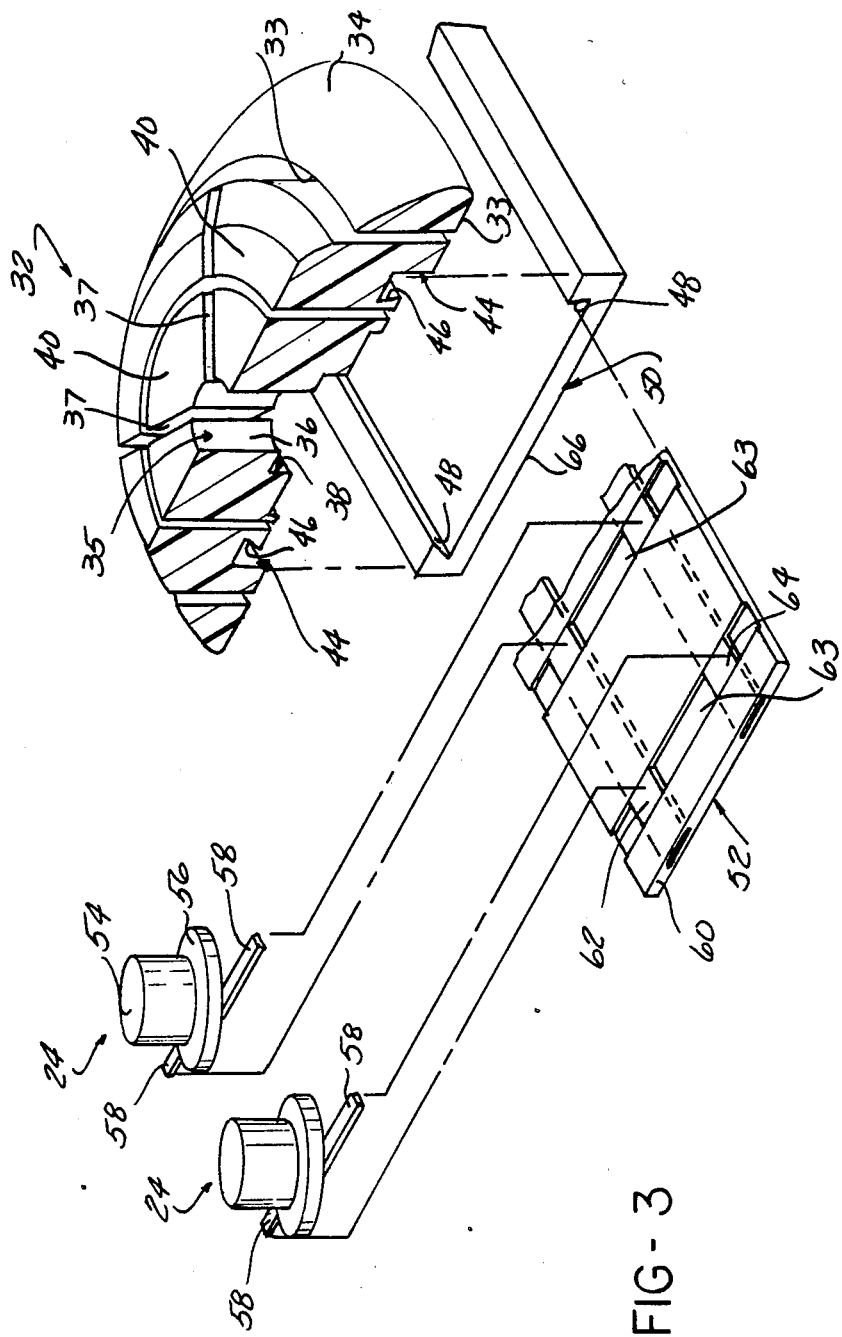
FIG. 3 is an enlarged, exploded, perspective view of a first embodiment of the harness means employed in the present invention.

The illumination devices or LED's 24 are electrically connected to the harnesses 21, 22, 23 and 25, as shown for harness 23 in FIGS. 2 and 3. The harness 23, which is constructed identical to the harnesses 21, 22 and 25, includes a housing 32 formed of a flexible plastic material. Preferably, the plastic material has a light color, such as white, to minimize its visibility when the illumination devices 24 are not activated.

The housing 32 may be in any shape, such as an elongated strip or individual members. However, it is preferred that the housing 32 be formed of separate members 32 as shown in FIG. 1. This minimizes the weight of the harness and provides a more comfortable feel for the wearer.

Each housing 32 preferably has a circular form in the plan view as shown in FIG. 3, a flat base 33, inwardly tapering outer side walls 34, and apertures 37. Each housing 32 also includes a slot 35 having a first upper section 36 and an enlarged lower section 38. The first and second sections 36 and 38 are configured to slidably receive one of the LED's 24. The bottom edge of the enlarged lower section 38 communicates with a second tunnel of translucent material 44 extending outward from the center of the housing 32. The slot or tunnel of translucent material 44 receives the electrically conductive harness 21.

The inwardly extending edges 46 of the slot 44 receive the inverted edges 48 of the cap member 50 to enable the cap member 50 to be snapped into engagement with the housing 32 after the electrical conductor assembly 52 is inserted therein.

As shown in FIG. 3, the illumination devices or LED's 24 include an illuminatible portion 54 and a base 56. In the embodiment shown in FIG. 3, the pair of contacts or leads 58 extend horizontally outward from the base 56. This configuration for the contacts 58 enables the illumination devices 24 to be slid into the slot 35 in the housing 32, with the upper surface of the illuminatible portion 54 of the side emitter 24 being disposed in substantial congruity with the upper surface 40 of the housing 32. This provides a smooth outer surface on the housing 32.

The electrical conductor assembly 52 includes a rectangularly shaped, elongated strip 60 preferably formed of an electrically insulating material, such as polyvinyl chloride or other suitable electrical insulator material. A pair of spaced, elongated conductors 62 and 64 are mounted longitudinally within the strip 60 and are completely surrounded by the strip 60. The conductors 62 and 64 are spaced apart a short distance within the strip 60 to receive the separate leads 58 from the side emitters 24. Slots 63 as shown in FIG. 3 are cut through the upper surface of the strip 60 to expose the upper surfaces of the conductors 62 and 64 at the locations where it is desired to mount one of the LED's 24 on the strip 60. Each of the slots 63 also prevents rotation of the LED's 24 once the LED's 24 are mounted in the conductor assembly 52.

The electrically conductive strip 52 fits within the slot 44 in the housing 32 prior to attachment of the cap member 50 to the housing 32 in one embodiment of this invention. This places the electrical conductors 62 and 64 in electrical contact with the leads 58 of each illumination device 24. The cap 50, due to its inwardly extending edges 48, provides spring-like biasing force on the electrically conductive strip 52 which maintains the conductors 62 and 64 in secure engagement with the leads 58 of each LED 24 as well as mounting the electrically conductive strip 52 and the LED's 24 within the housing 32.

Referring now to FIG. 4, there is shown the interconnection of the harnesses 22 and 25 in the sleeves 18 and 20, respectively, of the jacket with the front to back extending harnesses 23 and 21, respectively.

A connecting means denoted in general by reference number 100 comprises a connector mounted in the shoulder portion of the jacket 10. The connector 100 is in the form of a single piece body having a base 102 integrally connected with spaced legs 104 and 106, and an upper leg 108 which is hingedly attached at a bottom end 110 to the base 102. The upper leg 108 is movable between a first position parallel to and spaced from the intermediate leg 106 and an upwardly disposed position shown in phantom in FIG. 4 which enables the insertion of the harness 21 into a slot formed in the connector 100.

As shown in FIG. 4, the upper leg 108 is provided with a pin or notch 112 which fits into a suitably formed recess in the connector or harness 21 for securing the harness 21 and the connector 100 together.

The three spaced legs 104, 106 and 108 define a pair of spaced slots 114 and 116 which respectively receive a bared end of the harness 25 exposing both conductors 62 and 64 in the harness 21 and a cut out or slot in the harness 21. As shown in FIG. 4, the top surface of the harness 21 is bared to expose the conductors 62 and 64. Likewise, a window or slot, similar to the slot 63 shown in FIG. 3, is formed intermediately on the harness 21 exposing the upper surface of the conductors 64 and 62. This enables the conductors 64 and 62 of each of the harnesses 21 and 25 to be placed in electrical contact with a U-shaped electrically conductive contact or terminal 118 which is bonded or otherwise mounted within the connector 100. The terminal 118 provides an electrical connection between conductors of the two harnesses 21 and 25 and the power sources 90 and/or 91.

As shown in FIG. 2, a layer member 80 is attached to the outer surface of the garment 10 to provide a slot or tunnel for the housing 32. Preferably, the layer member 80 is formed of a transparent or at least a semi-transparent material such as nylon which will enable the light from the illumination devices 24 to be viewed therethrough when illuminated, but will completely cover these devices from view when they are not illuminated. The layer member 80 is attached at its side edges to the outer surface of the garment 10 by means of stitching or other attachment methods. In a preferred embodiment, a bead 82 of a light reflective material is formed on the edges of the stitched portions of the cover member 80.

As shown generally in FIG. 1 by reference number 90 and in greater detail in FIGS. 5 and 6, the illuminated article 10 is provided with an electrical power source 90, such as a conventional battery or batteries 128. The electrical power source 90 may include one or more conventional storage batteries 128 mounted within a suitable waterproof housing 94 as shown in greater detail in FIGS. 5 and 6 which is, in turn, mounted within a pouch formed in the interior of the jacket 10, such as within the front panels 12 and 14 as shown in FIG. 1. The electrical power source 90 includes a housing 94 formed of opposed side walls 95, a bottom wall 96, a front wall 97 and a hinged back wall 99. The back wall 99 is, preferably, connected by means of a living hinge at its lower end to the bottom wall 96 of the housing 94. A projection 112 is mounted on the upper portion of the back wall 99 and is removably insertable in a snap-type, waterproof fit into a correspondingly-shaped recess 111 in the harness 21. This removably secures the harness 21 in electrical contact with the power source 90. Suitable interlocking tongue and groove connections may also be employed between the hinged backwall 99 and the remainder of the housing 94 to provide the desired waterproof capability.

The housing 94 also supports an electrical switch 120 which is mounted within the housing 94 and includes two terminals 122 and 124 mounted on a back surface thereof. The contacts 122 and 124 are connectable with the conductors 62 and 64 in the harness 21. The switch 120 also includes battery terminals denoted generally by reference number 126 mounted on a bottom side which are connectable to the batteries 128. A single battery 128 or a pair of batteries 128 may be employed depending upon the voltage requirements of the illuminated article of this invention. A biasing means 130 is mounted on the bottom wall 96 of the housing 94 for biasing the batteries 128 upward into engagement with the switch 120 and the terminals 126. This may be in the form of a conventional leaf spring mounted on the base 96 at one end and angled upward into contact with the battery 128.

The switch 120 is provided with a push button 132 mounted on a front surface thereof and extending outward through the front wall 97 of the housing 94. The push button 132 is covered by a moisture-proof covering 134 which seals the interior electrical components of the switch 120. This enables the push button 132 to be activated by the wearer of the illuminated article 10 through the surface of the outer garment.

Means are also provided for mounting the housing 94 to the garment 10. As shown in FIG. 5, a pair of outwardly extending flanges 140 and 142 are integrally formed on the outwardly extending surface 97 of the housing 94. Conventional snap fasteners 144 are mounted on the outward surface of the flanges 140 and 142 to enable the housing 94 to be attached to the corresponding snap-on fasteners mounted interiorly in a pouch or pocket on an inside surface of the garment 10 as shown in FIG. 1. This securely mounts the electrical power source 90 and/or 91 in the garment 10.

It should be understood that the illuminated article 10 of the present invention includes at least one electrical power source 90. An additional power source 91 as shown in FIG. 1, may also be employed when the configuration of the harnesses 21, 22, 23 and 25 is such as to require two separete circuits on the garment. It is also possible to employ a single power source, such as power source 90, when the harnesses on the front, back and sleeve portions of the garment are interconnected by an intermediately extending harness which may be, for example, mounted horizontally or in any other desired position across the back portion of the garment between the harnesses 21 and 23. Such a harness would be attached by connectors similar to connector 100 shown in FIG. 4 to the harnesses 21 and 23.

Figure 7:
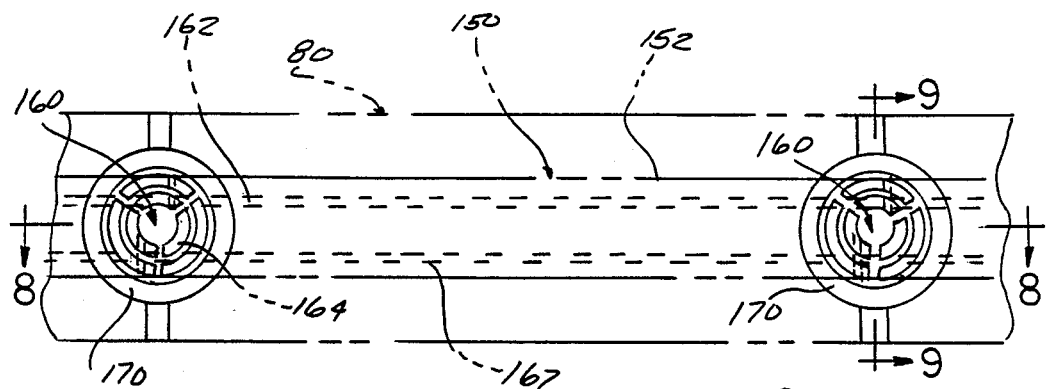
FIG. 7 is a plan view of another embodiment of the harness means of the present invention.
Figure 8:
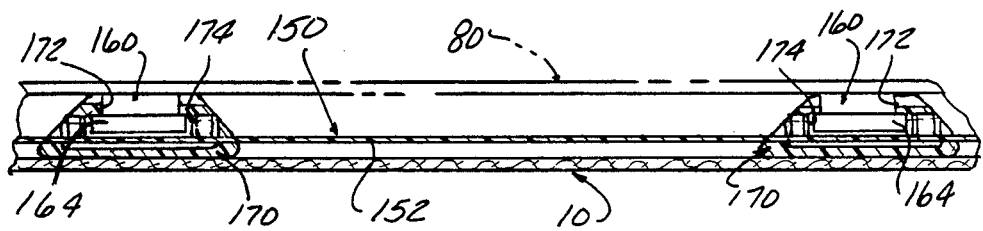
FIG. 8 is a cross-sectional view generally taken along line 8—8 in FIG. 7.
Figure 9:
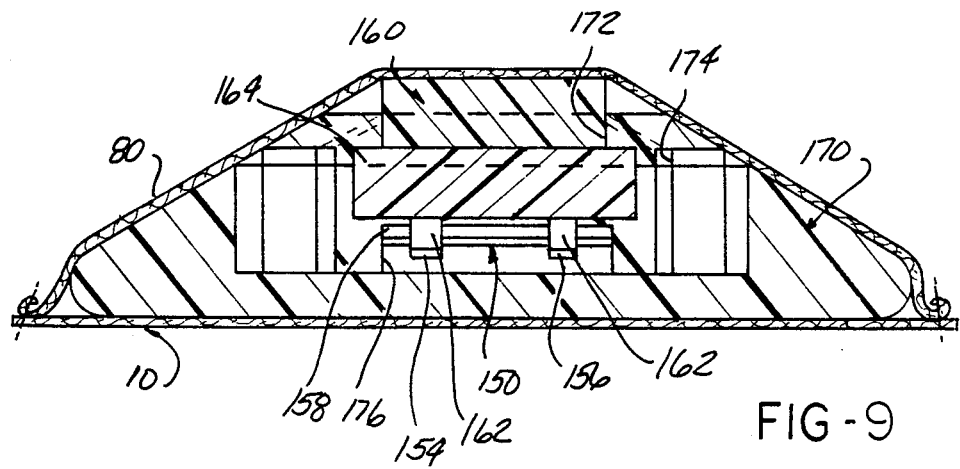
FIG. 9 is a cross-sectional view, taken along line 9—9 in FIG. 7 and similar to FIG. 2, but showing the other embodiment of the harness means.

Referring now to FIGS. 7, 8 and 9, another embodiment is depicted of the harness which may be employed in the illuminated article 10 of the present invention. The harness 150 is substantially identical to the harnesses 21, 22, 23 and 25 shown in FIG. 1 and described above but with minor differences therebetween in the form of the housing to receive the illumination devices or LED's 24. As shown in FIGS. 7, 8 and 9, the harness 150 includes an elongated strip 152 having a pair of spaced conductors 154 and 156 formed in the same manner as the conductive strip 60 shown in FIG. 3. Slots 158 are formed at selected various locations along the length of the strip 152 to expose the upper surfaces of the conductors 154 and 156 for connection to the leads or contacts of the illumination devices 160.

In this embodiment, the illumination devices 160, such as LED's and preferably side emitter LED's, have a low profile or height and include a pair of contact pads 162 extending outward from a base 164. The contact pads 162 engage the conductors 154 and 156 in the conductive strip 152 to provide power to the side emitter 24 when the power source is activated.

Each side emitter LED 160 is mounted in a housing 170 which, in the preferred embodiment, has a circular plan shape. Each housing 170 is formed with a centrally located cutout portion having a first, small diameter slot 172, an enlarged outer slot 174 and a horizontal extending through slot 176. The central and outer slots 172 and 174 receive an LED 160 in a snap-in fit for removably but securely mounting each LED 160 in the housing 170. The lower slot 176 is configured to receive the electrically conductive strip 152 which interconnects the various spaced housings 170 to enable insertion and removal of the entire harness 150 in the manner described above.

It should be understood that additional slots 158 may be formed at other locations along the length of the conductive strip 152 for insertion of additional housing 170 and LED's 160 in other desired positions if the wearer of the illuminated article of the present invention desires to change the position of or add additional illumination devices 160 to the garment 10.

Figure 10:
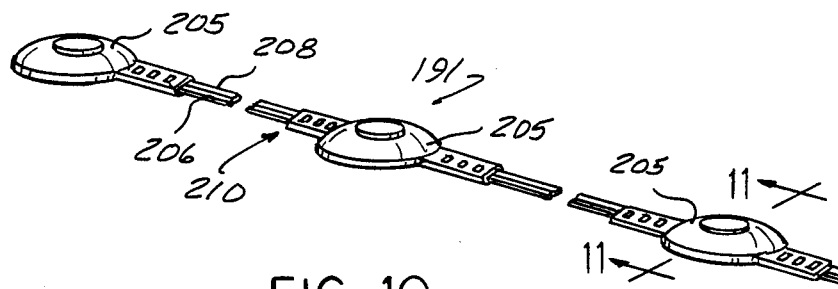
FIG. 10 is a perspective view illustrating another embodiment of the harness of the present invention.

In another embodiment of the present invention as illustrated in FIG. 10, a harness 191 is provided for mounting on an object or article. The harness 191 is particularly suited for use in wet or high moisture applications. The harness 191 includes an electrical power source 240 mounted within a waterproof housing, a pair of electrical conductors 206 and 208, preferably mounted in a ribbon cable 210, one or more illumination means 190 and a housing 205 surrounding and forming a waterproof enclosure about the illumination means 190 and the attached portion of the pair of electrical conductors 206 and 208. The harness 191 may include one or more illumination means 190 disposed at spaced locations along the length of the ribbon cable 210.

Figure 12:
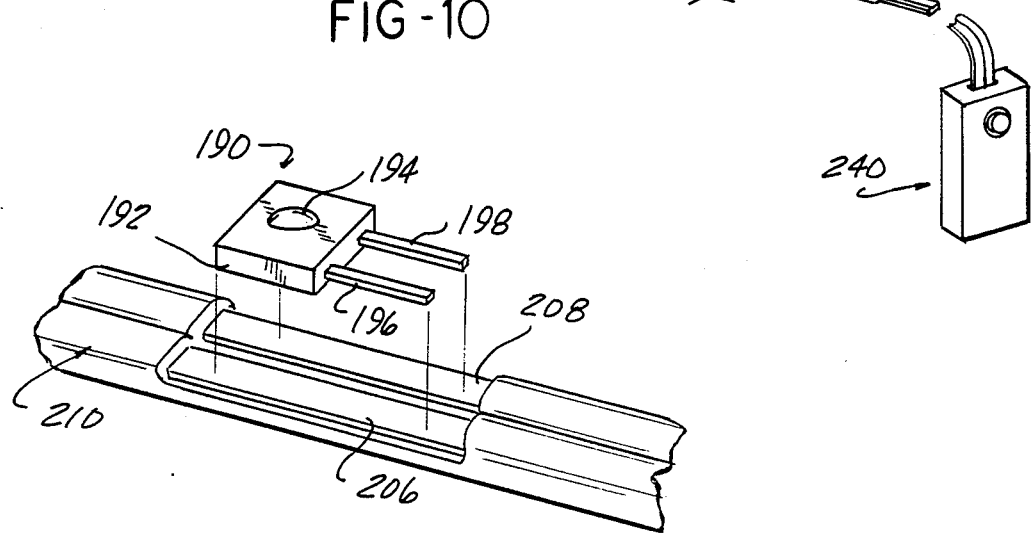
FIG. 12 is a partial, exploded view showing the attachment of the LED to the electrical conductors.

The illumination devices 190, preferably low profile side emitter LEDs, include an illuminatible base 192 and a dimple lens 194. Two leads 196 and 198, FIGS. 11 and 12, extend outward from the base 192 of the LED 190 and are electrically attached by solder or other means to the electrical conductor 206 and 208. The electrical conductors 206 and 208 are part of a flat ribbon cable 210. Contact between the leads 196 and 198 and the electrical conductors 206 and 208 is made by removing the upper portion of the insulative cover on one surface of the electrical conductors 206 and 208 to bare the surface of the conductors 206 and 208.

Figure 13:
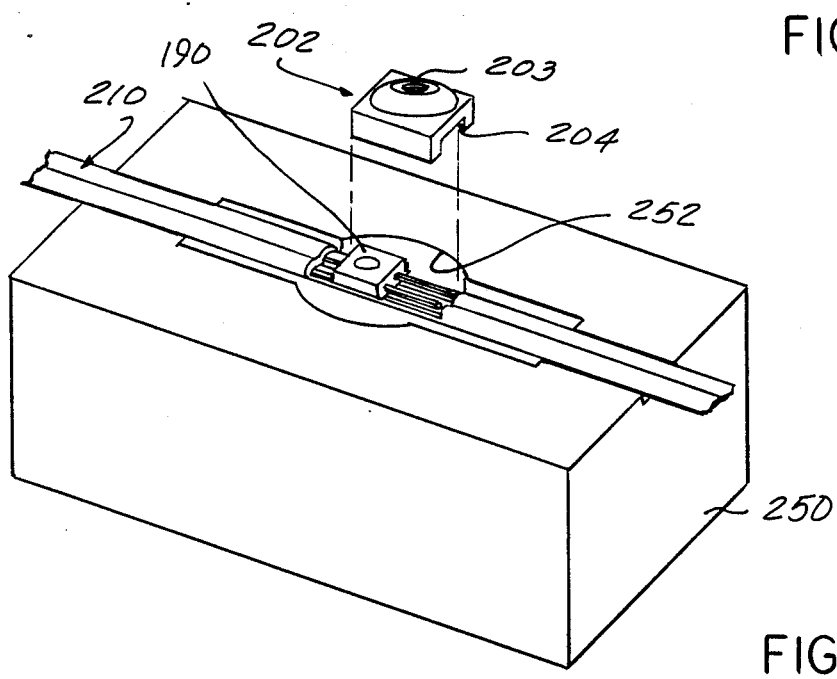
FIG. 13 is a partial, exploded, perspective view illustrating the mounting of the LED and conductors with the preload square in a mold used to form the housing about the LED and attached portions of the electrical conductors.

The LED 190 and the attached electrical conductors 206 and 208 are maintained in a fixed position in a mold, FIG. 13, by means of a preload insert or square 202. The preload square 202 is formed of a moldable plastic material, such as polyethylene for example, having a substantially square configuration with a small diameter bore 203 extending perpendicularly from a large, square cross section slot 204. The preload square 202 is snapped over the LED 190 attached to the cable 210, with the cable 210 extending outward from the slot 204 in the preload square 202.

FIG. 13 depicts one half of a mold 250 which includes a cavity 252 configured to form a housing 205 about the preload square 202, the illumination means 190 and the attached portion of the electrical conductors 206 and 208. The preload square 202 serves to position the LED 190 and the attached portions of the conductors 206 and 208 within the mold cavity 252. A single piece, waterproof, housing 205 is then formed about the illumination LED 190 and the conductors 206 and 208 and preload square 202 by any suitable molding technique, such as injection molding, in which molten material, such as polyethelene, is injected into the mold cavity 252 and cooled to a solid state thereby encapsulating the preload square 202, the LED 190 and the attached portions of the electrical conductors 206 and 208 in a solid waterproof enclosure.

Figure 11:
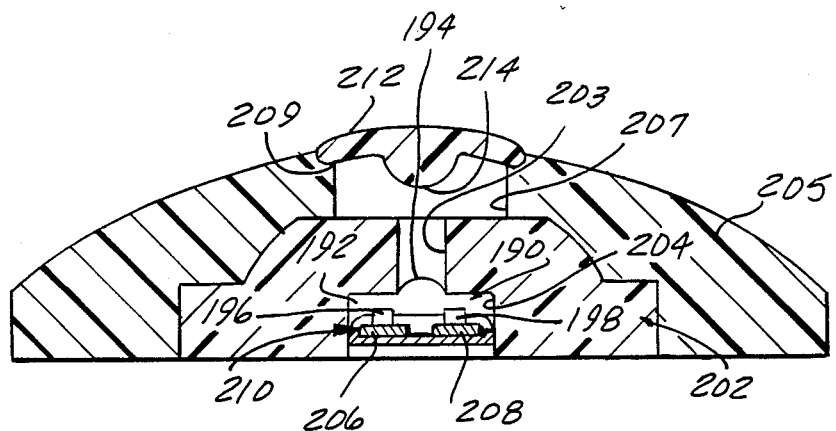
FIG. 11 is a cross-sectional view generally taken along line 11—11 of FIG. 10.

The housing 205 is formed with an enlarged bore 207, FIG. 11, having a shoulder 209 formed at one end. A light converging lens 212 with a magnification dimple 214 is snapped into the housing 205 while it is still warm from the molding operation. Light emitted from the LED 190 passes through the bore 205 in the preload square 202, the air gap in the bore 207 in the housing 205 and the lens 212. In order to increase the illumination effect created by the LED 190, it is preferred that the preload square 202 and the housing 205 be formed of a semi-translucent material to diffuse light from the LED 190 throughout the entire housing 205.

Thus, the sequence employed in forming the harness of the present invention generally includes the steps of:

1. attaching the leads 196 and 198 of an LED 190 to the electrical conductors 206 and 208, respectively, by soldering, for example, 2. inserting the conductors 206, 208 and the LED 190 into the cavity of a mold, and 3. molding a waterproof housing 205 over the components to form a waterproof enclosure completely around the LED and attached electrical conductors 190. This process is repeated for each LED 190 to form a complete harness 190.

In applications employing the preload insert or square 202, the insert 202 is snapped around the LED 190 and the electrical conductors 206 and 208 prior to insertion of the harness into the mold cavity. The molding of the housing 205 causes a slight melting of the outer surface of the preload square 202 to the housing 205.

Figure 14:
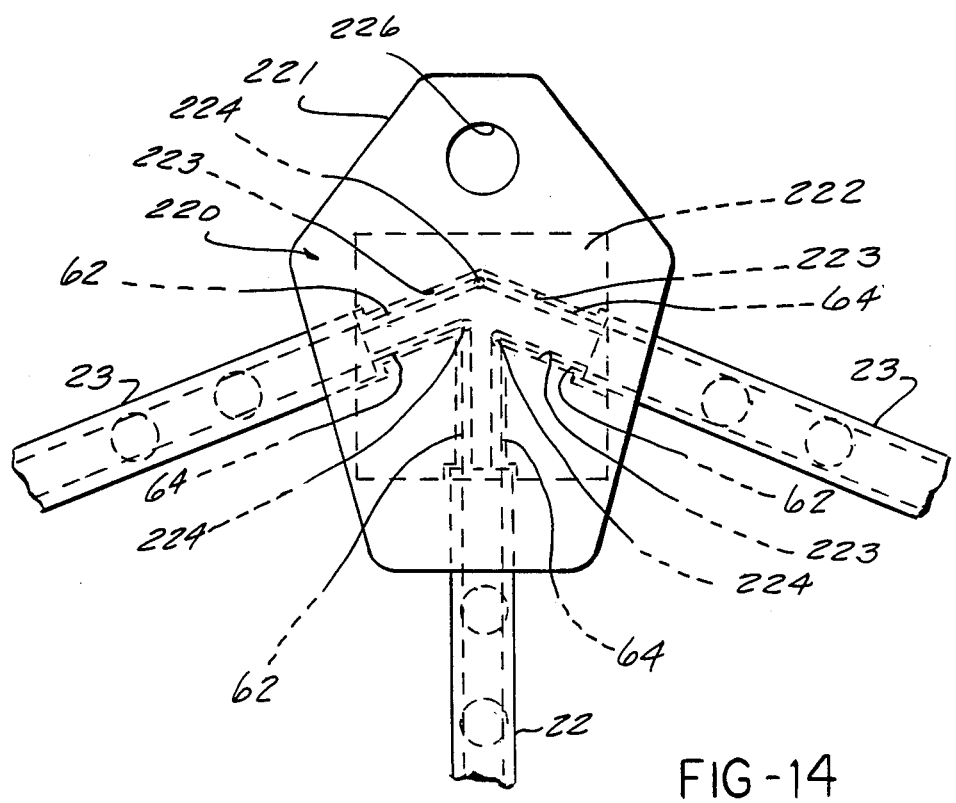
FIG. 14 is a plan view of another embodiment of the harness attachment means employed in the present invention.

Referring now to FIG. 14, there is shown a means for interconnecting several harnesses, such as harness 22 with harnesses 23, in a waterproof manner. As shown in FIG. 14, a waterproof, molded interconnection plate 220 fixedly encompasses a preload square 222 having a plurality of electrically conductive posts 224, such as rivets, mounted therein. The electrical conductors 62 and 64 of the various harnesses 22 and 23 are electrically connected to the posts 224 to form a series or parallel circuit between the various harnesses 22 and 23 and the power source.

The preload square 222 includes slots 223 sized to snugly receive the cable and conductors of the harnesses 22 and 23. The conductors may be directly connected together or connected indirectly through the posts 224. The preload square 222 and interconnected harnesses 22 and 23 are then inserted into a mold and the housing 221 molded thereabout according to the same process disclosed above to form a waterproof enclosure about the harness interconnections.

An attachment means 226, such as a snap fastener, button, etc., is mounted on the interconnection plate 220 to removably affix the interconnection plate to the article 10.

Figure 15:
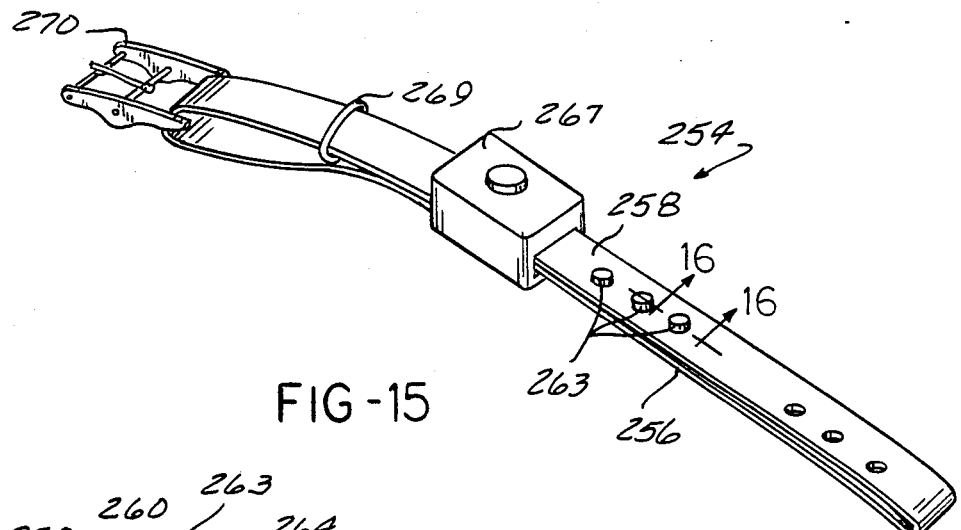
FIG. 15 is a perspective view illustrating the use of the harness of the present invention in a pet collar.
Figure 17:
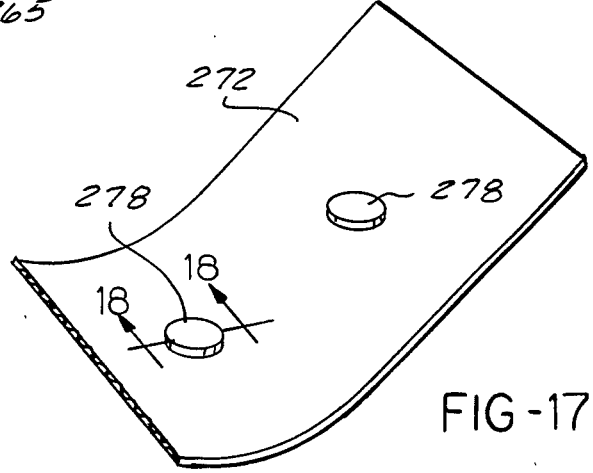
FIG. 17 is a partial, perspective view showing the mounting of a harness constructed in accordance with the teachings of the present invention on a thin fabric material layer.

The harness 190 described above and shown in FIG. 10, may have widespread application as a separate illuminated harness disposable in a cavity formed in an article, as described above, or separately attached to other articles, such as a pet collar as shown in FIG. 15 or integrally molded into a thin fabric layer as shown in FIG. 17 or employed separately by itself.

Figure 16:
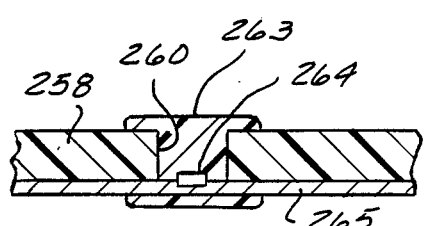
FIG. 16 is a cross-sectional view generally taken along line 16—16 in FIG. 15.

FIGS. 15 and 16 illustrate one example of mounting the harness 190 shown in FIG. 10 in a pet collar 254, such as a dog collar. The pet collar 254 may have any desired shape or length and is formed, by way of example, with two overlapping layers 256 and 258 which are joined together at their outer edges via suitable means, such as by stitching or an adhesive. A plurality of spaced apertures 260 are formed in the upper layer 258 of the collar 254 and receive an illumination means or LED 264 attached to electrical conductors 265 as described above. A housing 263 is molded about the collar 254 and aperture 260 on both sides of the collar layers 256 and 258 to encapsulate the LED 264 as shown in FIG. 16. The ends of the electrical conductors 265 are connected at one end to an electrical power source 267 which is insert molded to the collar 254 adjacent the conventional D-ring 269 and buckle 270.

Figure 18:
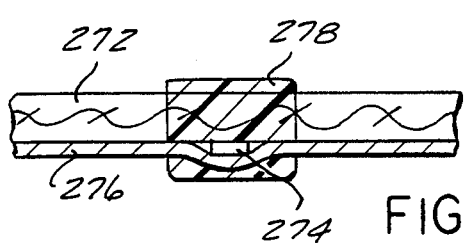
FIG. 18 is a cross-sectional view generally taken along line 18—18 in FIG. 17.

Similarly, as shown in FIGS. 17 and 18, the harness of the present invention may be attached to a thin fabric material layer 272, such as an article of clothing. In constructing the illuminated object illustrated in FIGS. 17 and 18, the LED 274 is attached to the electrical conductors 276 as described above and positioned adjacent one side of the fabric layer 272. A housing 278 is then formed by a molding process identical to that described above in which the molten plastic completely penetrates the fabric layer 272 and surrounds the LED 274 and attached portions of the electrical conductors 276 to form a waterproof enclosure as well as a attaching the harness to the fabric 272. For thick fabric layers, apertures as shown in FIG. 16 may be employed.

Figure 19:
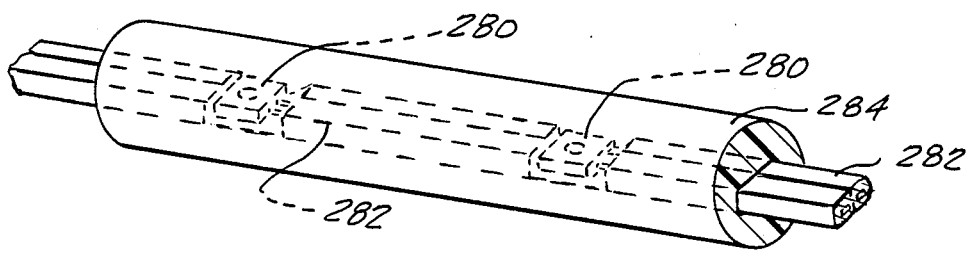
FIG. 19 is a perspective view of another embodiment of the harness of the present invention.

FIG. 19 depicts another embodiment of the harness in which illumination means 280, such as LED's, are attached to the electrical conductors 282 as before. The housing 284, which may have any desired shape such as the cylindrical, tubular shape shown in FIG. 19, is then molded around all of the LED's 280 and the electrical conductors 284 in a single body extending the entire length of the harness. It should be noted that in this application, the electrical conductors 282 may be provided without an insulative sheath or covering. Further, the harness may include an electric power source mounted in a waterproof housing and attached to the ends of the conductors 282 to a electric power source separate from the harness.

The illuminated article of the present invention overcomes many of the deficiencies encountered with previously devised illuminated articles specifically designed for use as wearing apparel or garments in that the entire illumination circuit or electrical harness may be left in the article when the article is to be cleaned. The illuminated article is also formed to provide an aesthetically pleasing appearance on the garment when the illumination circuit is not activated. Finally, the waterproof features of the electrical harness are particularly useful in a wet environment.

What is claimed is:

1. An illuminated object having an outer surface comprising:
   a plurality of harnesses, each harness including:
   an electric power source housed in a waterproof housing;
   electrical conductors connectable to the electric power source;
   an illumination means attached in electrical contact with the electrical conductors; and
   a housing surrounding and forming a waterproof enclosure about the illumination means and the attached portion of the electrical conductors adjacent to the illumination means;
   means for interconnecting the electrical conductors of a plurality of harnesses to form an electrical circuit between the illumination means in the harnesses and the electrical power source;
   the harnesses mounted on the object with the illumination means being viewable from the outer surface.

2. An illuminated object having an outer surface comprising:
   a harness including:
   an electric power source housed in a waterproof housing;
   electrical conductors connectable to the electric power source;
   an illumination means attached in electrical contact with the electrical conductors; and
   a housing surrounding and forming a waterproof enclosure about the illumination means and the attached portion of the electrical conductors, the housing comprising:
   a preload insert formed of a moldable material, the preload insert having a slot configured to encompass the illumination means and the attached portion of the electrical conductors; and an outer body moldingly joined to and encompassing the preload insert, the illumination means and the attached portion of the electrical conductors;

the harness mounted on the object with the illumination means being viewable from the outer surface.

3. The illuminated object of claim 2 wherein:
the preload insert has a through bore formed substantially perpendicularly to the slot;
the outer body has a through bore formed therein in communication with the illumination means; and
a lens is mounted on one end of the bore over the illumination means.

4. The illuminated object of claim 2 wherein the source of electrical power comprises:
a battery;
a waterproof housing for the battery;
means for connecting the battery in a waterproof manner to the electrical conductors in the harness; and
manually operable switch mounted in the housing for electrically connecting the battery to the electrical conductors for the flow of electrical power thereto.

5. The illuminated object of claim 2 wherein the object is a garment.

6. The illuminated object of claim 2 wherein the illumination means comprises a light emitting diode.

7. The illuminated object of claim 6 wherein the light emitting diode is a side emitter light emitting diode 8. An illuminated object having an outer surface comprising:
a plurality of harnesses, each harness including:
an electric power source housed in a waterproof housing;
electrical conductors connectable to the electric power source;
an illumination means attached in electrical contact with the electrical conductors; and
a housing surrounding and forming a waterproof enclosure about the illumination means and the attached portion of the electrical conductors;
the harness mounted on the object with the illumination means being viewable from the outer surface;
means for interconnecting the electrical conductors of a plurality of harnesses to form an electrical circuit between the illumination means in the harnesses and the electrical power source, the interconnecting means comprising:
a preload square, the preload square having slots formed therein for receiving the electrical conductors of a plurality of harnesses;
means for connecting the electrical conductors of the plurality of harnesses together; and
an interconnection plate surrounding and forming a waterproof enclosure about the preload square and interconnected ends of the electrical conductors of a plurality of harnesses.

9. The illuminated object of claim 8 further including a plurality of electrically conductive posts mounted within the interconnection plate and connectable to the electrical conductors in the harnesses.

10. An illuminated object having an outer surface comprising:
a harness including:
an electric power source housed in a waterproof housing;
electrical conductors connectable to the electric power source;
a plurality of illuminatible devices attached in electrical contact with the electrical conductors;
a plurality of discrete housings, each surrounding and encapsulating an illuminatible device and the attached portions of the electrical conductors;
the harness mounted on the object with the illumination means being viewable from the outer surface.

11. An illuminated object of in the form of an elongated band having an outer surface comprising:
a harness including:
an electric power source housed in a waterproof housing;
electrical conductors connectable to the electric power source; and
an illumination means attached in electrical contact with the electrical conductors;
an aperture formed in the band;
the illumination means disposed in the aperture and viewable from the outer surface of the band; and
a housing molded over the band, through the aperture in the band and about the illumination means to encapsulate the illumination means and the attached portion of the electrical conductors adjacent to the illumination means.

12. An illuminated object having an outer surface comprising:
a harness including:
an electric power source housed in a waterproof housing;
electrical conductors connectable to the electric power source;
an illumination means attached in electrical contact with the electrical conductors; and
a housing surrounding and forming a waterproof enclosure about the illumination means and the attached portion of the electrical conductors;
the harness mounted on the object with the illumination means being viewable from the outer surface;
the object including a woven fabric material layer;
the illumination means being disposed in registry with one side of the fabric layer; and
the housing moldingly impregnating and extending through both sides of the fabric material layer and encapsulating the illumination means.

13. A method of manufacturing an illuminatible harness comprising the steps of:
attaching the leads of an illumination means to electrical conductors;
positioning the illumination means and the attached portion of the electrical conductors in a mold;
molding a single piece, waterproof housing around the illumination means and the attached portion of the electrical conductors adjacent to the illumination means; and
connecting the ends of the electrical conductors to an electrical power source.

14. The method of claim 13 further including the steps of:
sequentially repeating all of the steps for each of a plurality of illumination means to be mounted on the harness.

15. The method of claim 13 wherein the step of positioning further comprises the step of:
attaching a preload insert formed of a moldable material to the illumination means and the attached portion of the electrical conductors to center the illumination means in the mold prior to molding the housing.

16. The method of claim 13 further including the steps of:
in the step of molding, forming a bore in the housing over the illumination means; and
attaching a lens to one end of the bore over the illumination means.

17. The method of claim 13 further comprising the steps of:
forming an aperture in an object; and
inserting the illumination means after attaching the illumination means to the electrical conductors into the aperture in the object before the illumination means and the object are placed into the mold and the housing is molded thereover.

18. An illuminatible harness comprising:
electrical conductors connectable to an electric power source;
a plurality of illumination means disposed at spaced locations in electrical contact with the electrical conductors; and
a plurality of housings, each housing surrounding and forming a waterproof body around one illumination means and the attached portion of the electrical conductors adjacent to the one illumination means.

19. The illuminatible harness of claim 18 further including:
an electric power source mounted in a waterproof housing;
one end of the electrical conductors being connected to the electric power source.

20. The illuminatible harness of claim 19 wherein the source of electrical power comprises:
a battery;
a waterproof housing for the battery;
means for connecting the battery in a waterproof manner to the electrical conductors in the harness; and
a manually operable switch mounted in the housing for electrically connecting the battery to the electrical conductors for the flow of electrical power thereto.

21. An illuminatible harness comprising:
electrical conductors connectable to an electric power source;
a plurality of illumination means attached at spaced locations in electrical contact to the electrical conductors; and
a housing surrounding and forming a single, molded, waterproof body encapsulating all of the illumination means and the attached portion of the electrical conductors adjacent to the illumination means.

* * * * *